(12) United States Patent
Geefay

(10) Patent No.: US 6,836,013 B2
(45) Date of Patent: Dec. 28, 2004

(54) METHOD FOR SEALING A SEMICONDUCTOR DEVICE AND APPARATUS EMBODYING THE METHOD

(75) Inventor: Frank S. Geefay, Cupertino, CA (US)

(73) Assignee: Agilent Technologies, Inc, Palo Alto, CA (US)

( * ) Notice: Subject to any disclaimer, the term of this patent is extended or adjusted under 35 U.S.C. 154(b) by 19 days.

(21) Appl. No.: 10/645,435

(22) Filed: Aug. 20, 2003

(65) Prior Publication Data

US 2004/0077127 A1 Apr. 22, 2004

Related U.S. Application Data

(62) Division of application No. 10/277,479, filed on Oct. 22, 2002.

(51) Int. Cl.[7] .............................................. H91L 23/12
(52) U.S. Cl. ...................................... 257/704; 257/710
(58) Field of Search ................................ 257/704, 706, 257/710, 678, 777, 778, 783

(56) References Cited

U.S. PATENT DOCUMENTS

| | | | |
|---|---|---|---|
| 4,684,763 A | | 8/1987 | Harada |
| 5,270,571 A | * | 12/1993 | Parks et al. ................. 257/686 |
| 5,821,175 A | * | 10/1998 | Engelsberg ................. 438/795 |
| 6,168,947 B1 | * | 1/2001 | Tzean et al. ............. 435/254.1 |
| 6,281,573 B1 | * | 8/2001 | Atwood et al. ............. 257/706 |

FOREIGN PATENT DOCUMENTS

| | | |
|---|---|---|
| GB | 2 383 192 | 3/2002 |
| JP | 9069585 | 3/1997 |
| WO | WO 03/030275 | 9/2001 |
| WO | WO 02/32203 | 10/2001 |

\* cited by examiner

*Primary Examiner*—David Nhu

(57) ABSTRACT

An apparatus includes a device chip having circuit elements fabricated on a substrate and a cap covering at least a portion of the device chip including the circuit elements such as thin film resonators. The placement of the cap on the device chip is sealed using a gasket having treaded surface for improved adhesion, cold weld deformation of gold, and decreased susceptibility to foreign particles resulting in a superior seal.

16 Claims, 4 Drawing Sheets

METHOD FOR SEALING A SEMICONDUCTOR DEVICE AND APPARATUS EMBODYING THE METHOD

This is a divisional of copending application Ser. No. 10/277,479, filed on Oct. 22, 2002 the entire disclosure of which is incorporated herein by reference.

BACKGROUND

The present invention relates to semiconductor circuit fabrication technology, and more particularly, to protection and sealing of circuit elements using a cap and gasket.

Semiconductor circuits and devices are often manufactured on a substrate material by depositing and patterning various layers of material including conducting and semiconducting material as well as insulating material. These circuits are typically very small (having dimensions in micron range or smaller), fragile, and susceptible to environmental factors (such as corrosion by interaction with water molecules in the air). Accordingly, in some applications, it would be preferable to protect the circuits by hermetically sealing the circuits using a sealing cap.

Such sealing can be accomplished using a gasket between the cap and the device chip. FIG. 1 illustrates an apparatus 100 including a device chip 110 including circuits covered by a cap 120 sealed using a gasket 130. The gasket 130 can be very thin, for example, in the order of tens of microns. To seal the device chip 110 using the cap 120 and the gasket 130, the cap 120 and the gasket 130 is pressed onto the device chip 110. The pressured is distributed to the entire surface of the contact area between the gasket 130 and the device chip 110. Accordingly, pressure per square unit of the contact area is relatively low. For this reason, placement of the cap 120 onto the device chip 110 can result in marginal or poor sealing of the gasket 130 to the device chip 110, resulting from inadequate pressure. Further, small foreign particles between the gasket 130 and the device chip 110 can breach the seal 132.

Accordingly, there remains a need for a method of fabricating semiconductor devices that overcomes these problems and an apparatus embodying the method.

SUMMARY

The need is met by the present invention. According to a first aspect of the present invention, an apparatus has a device chip including circuit elements fabricated on a substrate and a cap covering at least a portion of the device chip. A gasket with treaded surface seals the cap to the device chip.

According to a second aspect of the present invention, an apparatus includes a device chip including circuit elements and a cap covering at least a portion of the device chip. The device chip has treaded surface for sealing the cap to the device chip.

According to a third aspect of the present invention, a method of fabricating an apparatus is disclosed. First, a device chip including circuit elements on a substrate is fabricated. Then, the circuit elements are enclosed using a cap and a gasket, the cap covering at least a portion of the device chip, and the gasket having treaded surface.

Other aspects and advantages of the present invention will become apparent from the following detailed description, taken in combination with the accompanying drawings, illustrating by way of example the principles of the invention.

DETAILED DESCRIPTION

Figure 1:
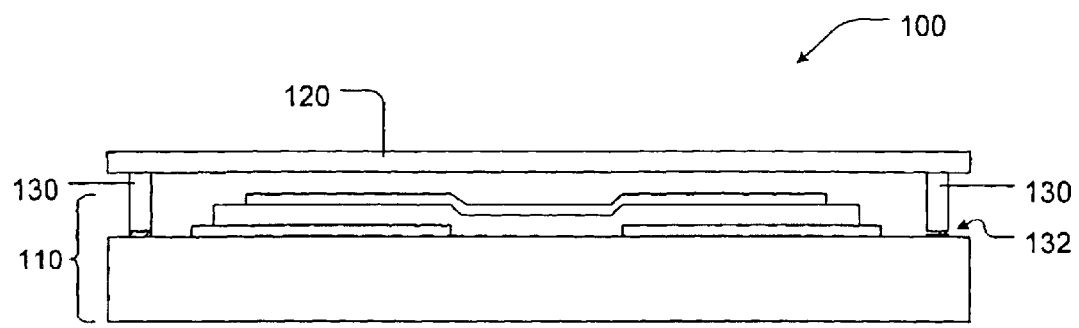
FIG. 1 illustrates a cross sectional cutaway side view of a device manufactured according to prior art.

As shown in the drawings for purposes of illustration, the present invention is embodied in an apparatus including a device chip and a cap for covering at least a portion of the device chip. The cap includes a gasket for sealing the covered portion. The gasket has treaded surface. The narrow treads increase the effective pressure and deformation at the bonding surfaces by allowing more lateral displacement of the bonding surface material. Further, the tread creates tread cavities which break up the bonding surface into separate successive structures thus prevents the perpetuation of defects across a single bonding surface. The cavities also confine leaks of the associated defective tread from spreading to other portions of the tread.

Figure 2A:
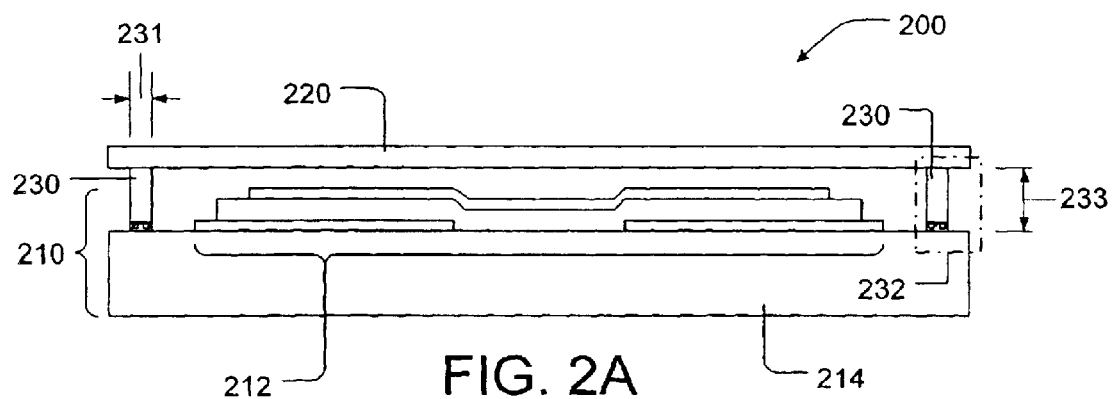
FIG. 2A illustrates a cross sectional cutaway side view of an apparatus according to one embodiment of the present invention.

FIG. 2A illustrates an apparatus 200 according to one embodiment of the present invention. The apparatus 200 includes a device chip 210 including circuit elements 212 fabricated on a substrate 214. A cap 220 covers at least a portion of the device chip 210. A gasket 230 seals the cap 210 onto the device chip 210. The gasket 230 has treaded surface to improve the sealing. The treaded feature of the gasket 230 is generally illustrated in boxed area 232.

Figure 2B:
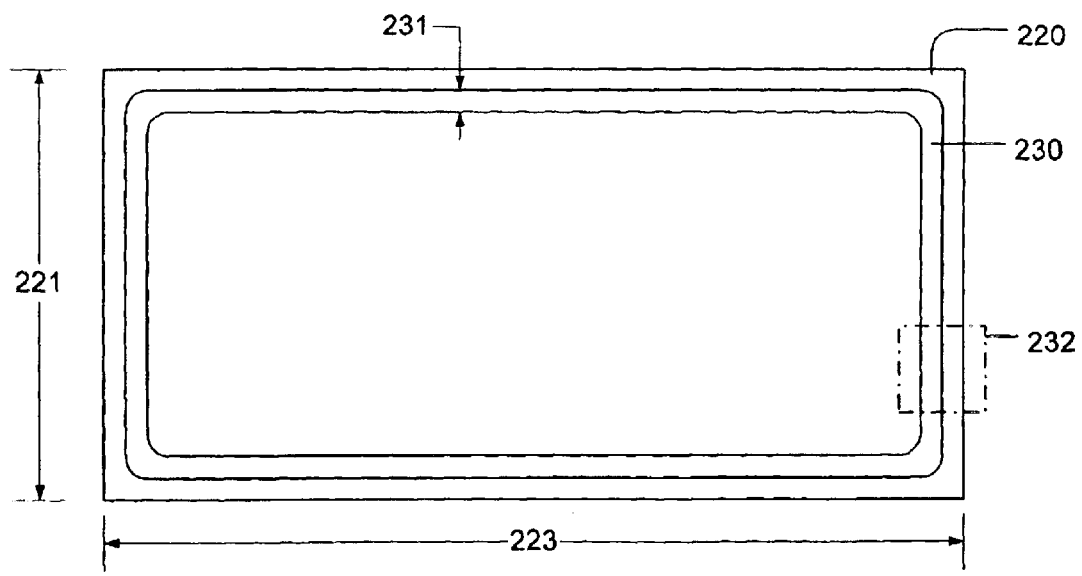
FIG. 2B illustrates a bottom view of a cap of the apparatus of FIG. 2A.

FIG. 2B illustrates a bottom view of the cap 220 of the apparatus 210. Further, FIG. 2B illustrates the layout of the gasket 230 as to hermetically enclose the circuits 212 of the device chip 210. The cap 220 is typically fabricated from Silicon and can include the gasket 230 attached to or as a part of the cap 220. In fact, in one embodiment, the cap 220 and the gasket 230 are made from the same material and are fabricated using known semiconductor fabrication technology using photoresist masking and etching steps. The size and the shape of the cap 220 can vary widely depending upon the requirements of the application. In experiments, caps having widths 221 and lengths 223 ranging from 0.4 millimeters (mm) to 2 millimeters have been produced. The cap 220 is generally rectangular in shape; however, this is not necessary and can be any shape. When placed on the device chip 210, the cap 220 covers at least a portion of the device chip 210.

Referring to FIGS. 2A and 2B, in addition to sealing the circuit 212, the gasket 230 acts as a spacer to provide sufficient spacing between the substrate 214 of the device chip 210 and the cap 220. In one embodiment, the gasket 230 has a thickness 231, or width, in a range of four to 30 microns and height 233 in a range of five to 50 microns. The gasket height 233, in the illustration, is the distance between the device chip 210 and the cap 220. Typically, the gasket 230 is made from the same material as the cap 220 which is often silicon.

Figure 3A:
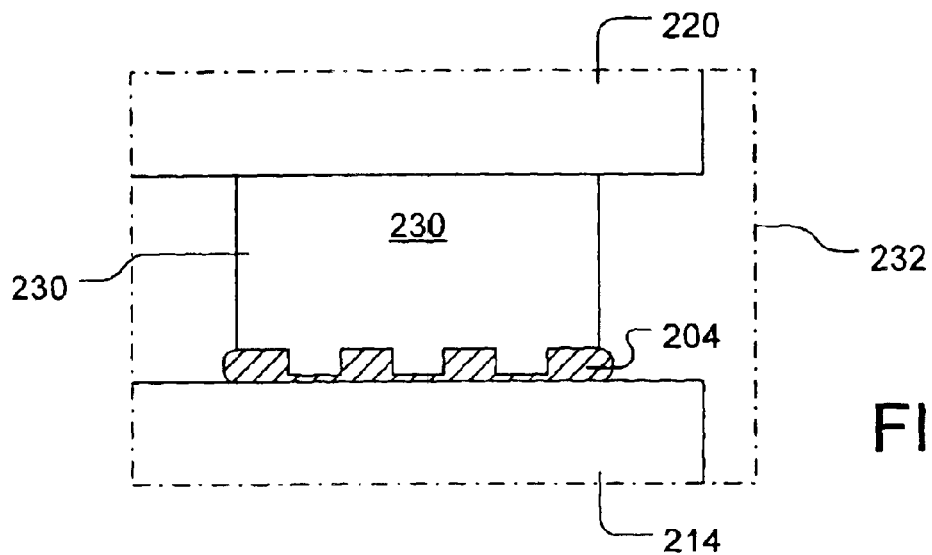
FIG. 3A illustrates a portion of the apparatus of FIG. 2A in a greater detail.
Figure 3B:
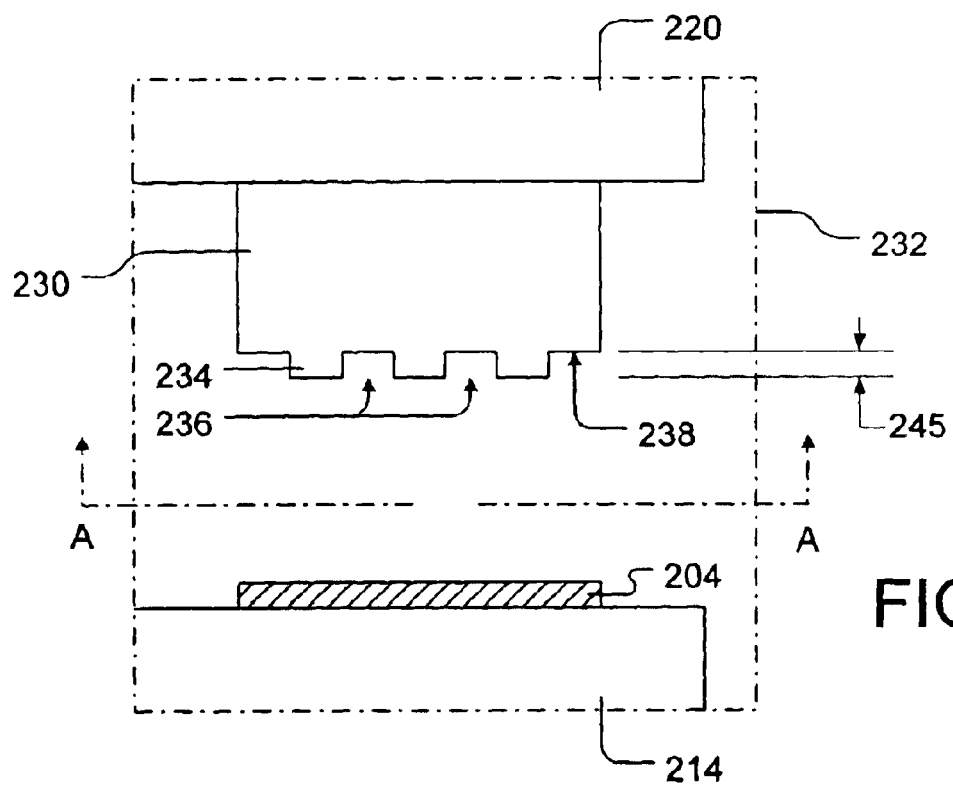
FIG. 3B illustrates the portion illustrated in FIG. 3A in an alternative state.
Figure 3C:
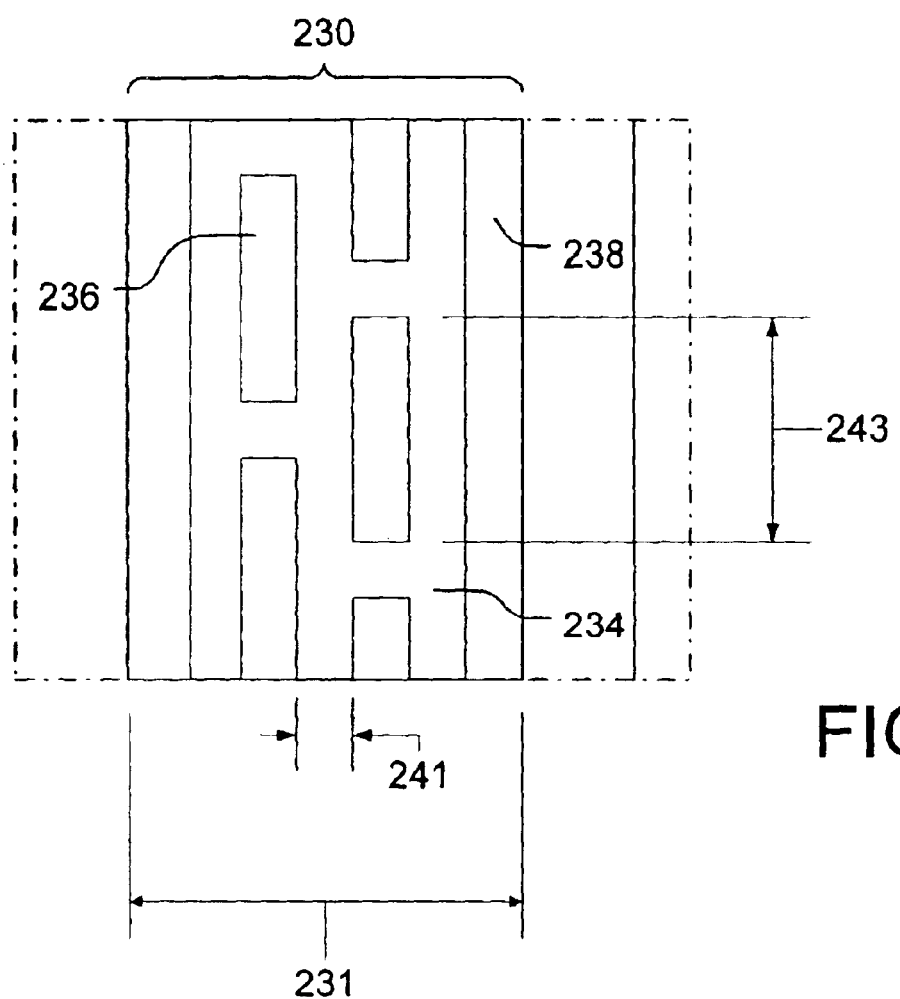
FIG. 3C illustrates a bottom view of a portion of the gasket of FIG. 3B.

Area 232 is illustrated in greater detail in FIG. 3A. FIG. 3B also illustrates, in greater detail, the area 232 of FIGS. 2A and 2B but with the gasket 230 separated, for clarity and relative ease of discussion, from the substrate 214 of the device chip 210. FIG. 3C shows a bottom view of a portion of the gasket 230 of FIG. 3B along line A—A.

Referring to FIGS. 3A, 3B, and 3C, the gasket 230 has a surface 238 and tread 234 raised from the surface 238. The device chip 210 can include adhesive 204 to improve adhesion of the gasket 230 to the device chip substrate 214 resulting in a better seal. For the adhesive 204, polyamide or benzocyclobutene (BCB) can be spun on the device chip 210. Alternatively, the adhesive 204 can include other materials, for example, metallic alloy such as lead-tin, gold-tin, or gold-silicon where the tread can be coated with at least one of the metals.

When the gasket 230 contacts the adhesive 204, a seal is created with the device chip substrate 214. The tread 234 defines tread cavities 236 that are filled with the adhesive 204 to form a better seal compared with a seal achieved using a gasket without treads or tread cavities. The tread 234 increases the total adhesion surface of the gasket 230 compared to a non-treaded gasket surface and permits some adhesive to remain in the cavity 236 between the raised treads 234. Further, the tread cavities 236 localize any imperfections or foreign particles within a cavity thereby improving a hermetical seal around the circuit elements 212 of FIG. 2A.

In one embodiment, width 241 of the tread 234 ranges from one to five microns, the tread 234 defining the cavities 236 having similar width. The cavities 236 have length 243 ranging from ten to 50 microns. The tread depth 245 can range from one to three microns. All these measurements can vary widely (even outside the specified ranges discussed herein) depending on the material, technology, and the requirements of the apparatus 200.

Figure 4A:
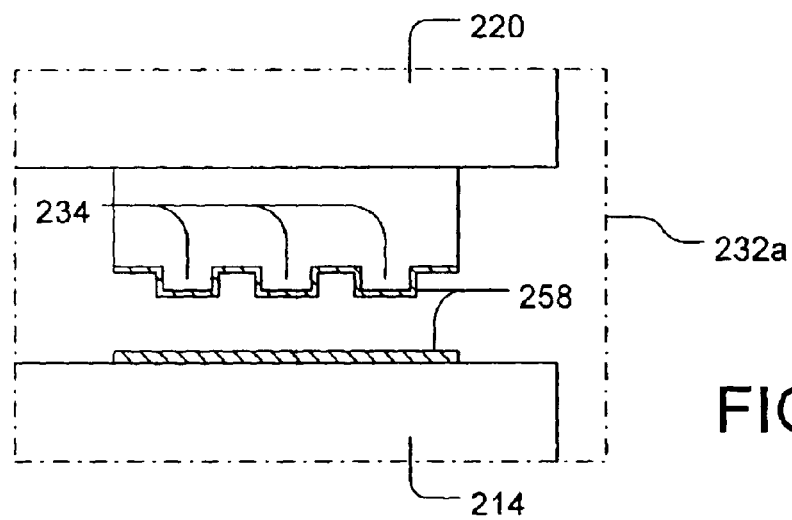
FIGS. 4A and 4B illustrate a portion of an alternative embodiment of the apparatus of FIG. 2A in a greater detail.
Figure 4B:
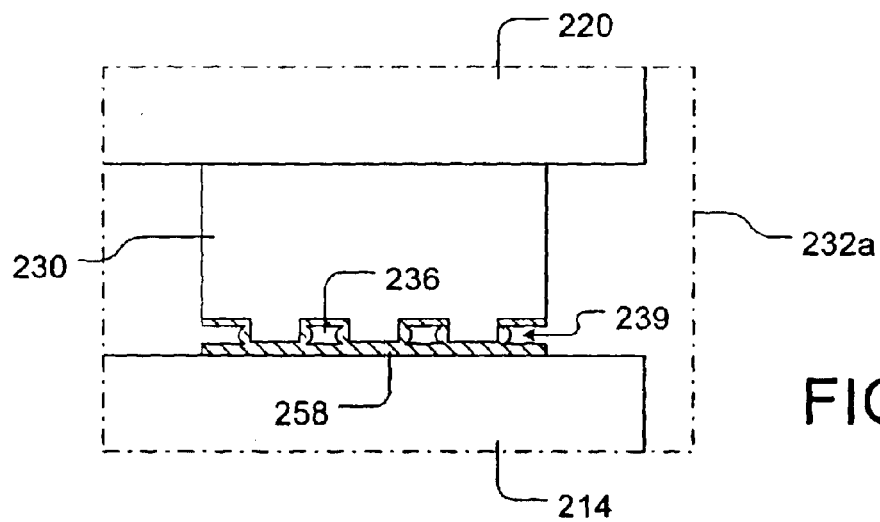

In FIGS. 4A and 4B, an alternative embodiment of the apparatus 200 of FIG. 2A is illustrated using detail area 232a. Portions of FIGS. 4A and 4B are similar to those shown in the preceding Figures. For convenience, portions in FIGS. 4A and 4B that are similar to portions in the preceding Figures are assigned the same reference numerals, analogous but changed portions are assigned the same reference numerals accompanied by a letter "a", and different portions are assigned different reference numerals.

Referring to FIGS. 4A and 4B, weld-metal 258 is placed on the gasket 230, on the device chip substrate 214, or both (as illustrated) for cold-weld bonding of the gasket 230 onto the device chip substrate 214. When pressed together to form a bond, narrow treads 234 allow the weld-metal such as gold to squeeze (bulge) out into the tread cavities 236 encouraging deformation 239 and more effective welding between the gasket 230 and the device chip substrate 214. Further deformation of weld-metal 258 resulting from the imprint displacement of the metal by the narrow tread 234 further enhances the welding process. The gasket 230 lends strength to relatively more delicate tread 234.

In a sample embodiment, to bond the gasket 230 onto the device chip substrate 214, the gasket 230 is applied onto the substrate 214 under pressure (for example, about 80 megapascals) and temperature (about 350 degrees Celsius). The gold layers 258 can be about 0.5 to 1.5 microns thick but this may vary widely. The metal adhesive 258 is typically deposited on the cap 220, the device chip 210, or both using conventional sputtering or evaporation process. The cold weld bonding process is sensitive to contamination. Accordingly, the gold bonding surfaces are often cleaned by ion mill process, sputter etching process, plasma cleaning process, or a combination of these techniques to maintain proper cleanliness prior to bonding.

Figure 4C:
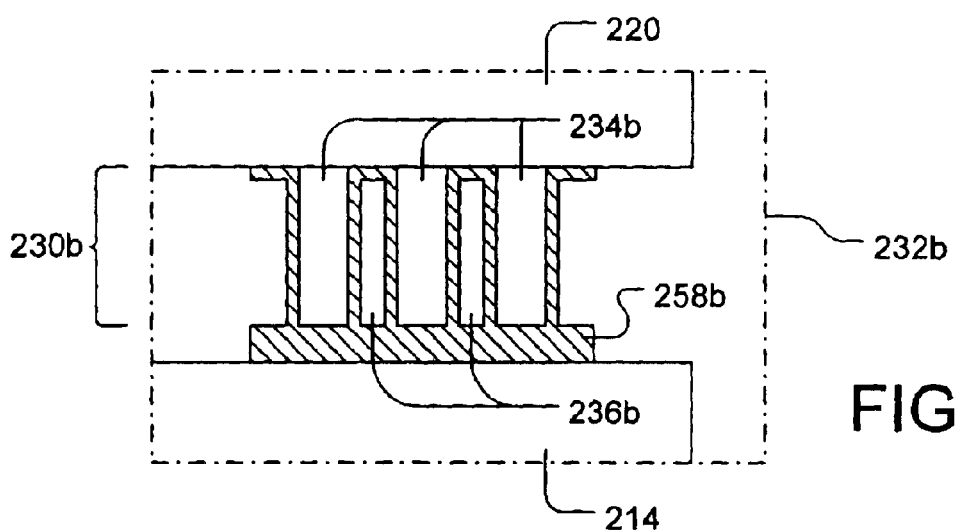
FIG. 4C illustrates a portion of another alternative embodiment of the apparatus of FIG. 2A in a greater detail.

In FIG. 4C, another embodiment of the apparatus 200 of FIG. 2A is illustrated using detail area 232b. Portions of FIG. 4C are similar to those shown in the preceding Figures. For convenience, portions in FIG. 4C that are similar to portions in the preceding Figures are assigned the same reference numerals, analogous but changed portions are assigned the same reference numerals accompanied by a letter "b", and different portions are assigned different reference numerals.

Referring to FIG. 4C, treads 234b define the entire gasket 230b. The treads 234b extend from the cap 220 to the chip substrate 214. In this case, the tread 234b also serves as a spacer eliminating the need for a separate gasket. In the illustrated embodiment, the metal adhesive 258b covers the entire gasket 236b/tread 234b as well as portions of the cap substrate 242. This embodiment is relatively less strong as the embodiment illustrated in FIG. 4A and FIG. 4B; however, the embodiment illustrated by FIG. 4C requires less processing. Under the current technology, to maintain adequate strength by the gasket 230, 230a, or 23b, a ratio of tread height 233 of FIG. 2A to tread width 231 of FIG. 2A of 3:1 is preferred. Here, the treads 234b and the gasket 230b are identical parts.

From the foregoing, it will be appreciated that the present invention is novel and offers advantages over the current art. Although a specific embodiment of the invention is described and illustrated above, the invention is not to be limited to the specific forms or arrangements of parts so described and illustrated. For example, the treads and tread cavities can be fabricated on the substrate 214 of the device chip 210 rather than on the gasket 230. Further, both the device chip 210 and the gasket 230 can include the treads, and such treads can be interlocking. Note that differing configurations, sizes, or materials may be used to practice the present invention. In particular, in the Figures, a device chip having two resonators is sealed by the cap and the gasket; however, the present invention is not limited to such a device chip. The invention is limited by the claims that follow. In the following, claims drafted to take advantage of the "means or steps for" provision of 35 USC section 112 are identified by the phrase "means for."

What is claimed is:

1. An apparatus comprising:
   a device chip including circuit elements fabricated on a substrate;
   a cap covering at least a portion of said device chip; and
   gasket with treaded surface sealing said cap to said device chip.

2. The apparatus recited in claim 1 wherein said treaded surface includes tread cavities.

3. The apparatus recited in claim 1 wherein said device chip includes adhesive on which said gasket is attached.

4. The apparatus recited in claim 1 wherein said cap is cold-weld bonded onto said device chip.

5. The apparatus recited in claim 4 wherein gold is used as cold-welded metal.

6. The apparatus recited in claim 1 wherein said cap hermetically seals said circuit elements.

7. The apparatus recited in claim 1 wherein said gasket having a width in a range of four to 30 microns.

8. The apparatus recited in claim 1 wherein said gasket having a thickness in a range of five to 50 microns.

9. The apparatus recited in claim 1 wherein said tread having a width in a range of one to five microns.

10. The apparatus recited in claim 1 wherein said tread defines tread cavities, each tread cavity having a width ranging from one to five microns.

11. The apparatus recited in claim 1 wherein said tread defines tread cavities, each tread cavity having a depth in a range of one to three microns.

12. The apparatus recited in claim 1 wherein said tread defines tread cavities, each tread cavity having a length in a range of 10 to 50 microns.

13. The apparatus recited in claim 1 wherein said gasket is made from same material as said cap.

14. An apparatus comprising:

a device chip including a circuit elements;

a cap and a gasket, said cap covering at least a portion of said device chip; and said device chip and said gasket having a treaded surface adapted to seal said cap to said device chip.

15. The apparatus recited in claim 14 wherein said treaded surface includes tread cavities.

16. The apparatus recited in claim 14 further comprising gasket as a seal between said device chip and said gasket.

* * * * *